United States Patent
Shiah

(10) Patent No.: US 7,514,951 B2
(45) Date of Patent: Apr. 7, 2009

(54) NEGATIVE VOLTAGE NOISE-FREE CIRCUIT FOR MULTI-FUNCTIONAL PAD

(75) Inventor: Chun Shiah, Hsinchu (TW)

(73) Assignee: Etron Technology, Inc., Hsin-Chu (TW)

( * ) Notice: Subject to any disclaimer, the term of this patent is extended or adjusted under 35 U.S.C. 154(b) by 104 days.

(21) Appl. No.: 11/230,387

(22) Filed: Sep. 20, 2005

(65) Prior Publication Data

US 2007/0063729 A1    Mar. 22, 2007

(51) Int. Cl.
*H03K 19/00* (2006.01)
*H03K 19/013* (2006.01)
*G01R 31/00* (2006.01)
*G01R 31/28* (2006.01)
*G01N 27/00* (2006.01)
*G06F 11/00* (2006.01)
*G06F 11/30* (2006.01)
*G06K 5/04* (2006.01)
*G08C 25/00* (2006.01)
*H03M 13/00* (2006.01)
*H04L 1/00* (2006.01)

(52) U.S. Cl. .................. 326/16; 326/18; 324/500; 324/557; 714/100; 714/699; 714/724; 714/746

(58) Field of Classification Search .................. 326/16
See application file for complete search history.

(56) References Cited

U.S. PATENT DOCUMENTS

| 4,893,029 A | 1/1990 | Matsuo et al. |
| 6,812,595 B2 * | 11/2004 | Marino ................. 307/125 |
| 6,826,025 B2 | 11/2004 | Singh et al. |

* cited by examiner

*Primary Examiner*—Rexford Barnie
*Assistant Examiner*—Matthew C Tabler
(74) *Attorney, Agent, or Firm*—Saile Ackerman LLC; Stephen B. Ackerman

(57) ABSTRACT

A circuit and a method are provided to produce a noise-free multi-input I/O pad for an integrated circuit chip. The circuit includes a normal mode internal node, which connects to normal mode circuitry and a test mode internal node, which connects to test mode circuitry. There are separate transfer devices which connect the I/O pad to the normal mode circuitry and to the test mode circuitry. In addition, a third transfer device, a load device, and a new intermediate internal node are added to prevent negative input voltage swings which occur on the I/O pad during the normal mode from causing the transfer gate to the test mode circuitry from turning ON causing chip failure.

20 Claims, 2 Drawing Sheets

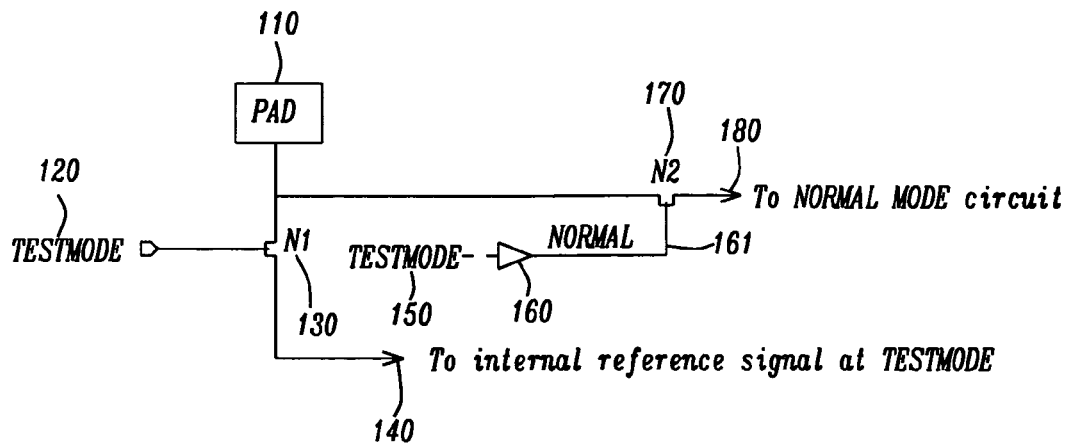
FIG. 1a – Prior Art
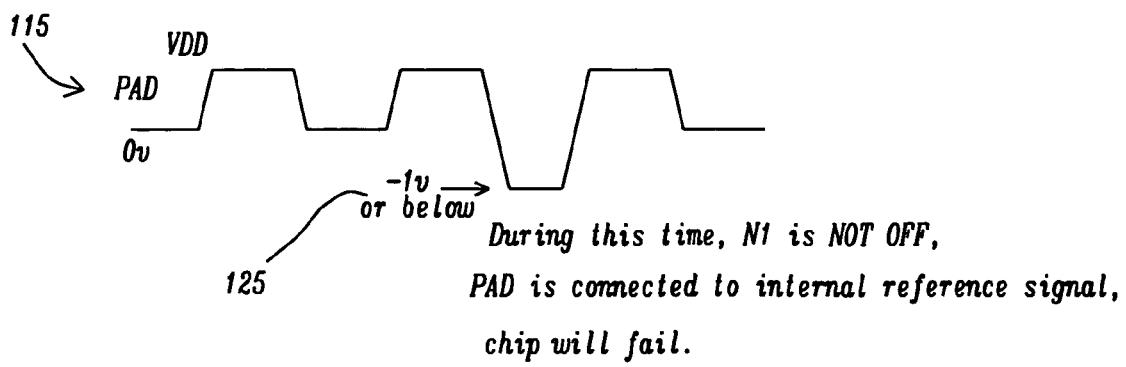
FIG. 1b – Prior Art

NEGATIVE VOLTAGE NOISE-FREE CIRCUIT FOR MULTI-FUNCTIONAL PAD

BACKGROUND OF THE INVENTION

1. Field of the Invention

The present invention generally relates to noise problems at the input pads of integrated circuits. More particularly, this invention relates to a circuit and a method for eliminating negative voltage noise effects on multi-function input/output pads.

2. Description of the Prior Art

FIG. 1a shows a prior art input/output (I/O) pad of an integrated circuit. The I/O pad 110 feeds into two transfer gates, N1 (130) and N2 (170). In test mode, the Test Mode line 120 is driven to a HIGH, VDD level, which turns ON the transfer gate N1 (130). This action connects the pad 110 to some internal reference signal. This allows the reference signal to be controlled by the external pad 110 during test mode. During Normal mode, the Test Mode signal 150 or 120 will be low or inactive. The inverter 160 will produce a high level at node 161. This is the Normal mode signal, which activates transfer device N2 (170) during Normal mode. During normal mode operation, the pad 110 is connected to the normal mode circuit 180. In addition, during normal mode, the Test mode signal 120 is low or inactive and transfer device N1 (130) is OFF. This disconnects the path from the pad 110 to the internal reference signal node 140.

FIG. 1b shows a prior art timing diagram 115 for a variable signal, which is applied, to the pad 110 in FIG. 1a. The signal shown in FIG. 1b, has an under shoot 125 where the voltage falls to −1 Volt or below. During this time device N1 is not OFF, and the pad is connected to the test mode internal reference signal node 140 in FIG. 1a. This will cause the chip to fail.

U.S. Pat. No. 6,812,595 B2 (Marino) describes a protection circuit and method for reducing noise received at a circuit operating on a voltage reference supply. The circuit includes a reference voltage source and at least one circuit which are connected together via a switch. A memory element which is attached to the switch is used to remember the previously stored reference voltage. Noise produced by a power element cannot disturb the circuit since the proper reference voltage has been previously stored in the memory element.

U.S. Pat. No. 6,826,025 (Singh, et al.) discloses an integrated circuit having either or both ESD and noise suppression devices that use the inherent resistance in the substrate as an ESD trigger and/or part of the noise suppression.

U.S. Pat. No. 4,893,029 (Matsuo, et al.) describes a semiconductor integrated circuit which has an input circuit, an internal circuit, and an output circuit. These circuits are all formed on a single chip and are connected to common power source lines. The input circuit includes an ordinary Schmitt trigger circuit, and an FET. The FET is turned ON for a predetermined period of time by a control signal when the potentials of the power source lines (positive power source line and an earth line) are caused to fluctuate as a result of the internal circuit or the output circuit operating. Because of this, the level to detect the rising of the input signal is set to a level higher than the ordinary level for the period of time during which the potentials of the power source lines fluctuate.

SUMMARY OF THE INVENTION

It is therefore an object of the present invention to provide a circuit and a method for providing a noise-free multi-input I/O pad for an integrated circuit chip.

The objects of this invention are achieved by a negative voltage noise-free circuit for multi-functional pads. This circuit is driven by an input/output (I/O) pad of an integrated circuit chip. The circuit includes a normal mode internal node, which connects to normal mode circuitry and a test mode internal node, which connects to test mode circuitry. There is a first transfer device switch which connects the I/O pad to an intermediate internal node. Also, there is a second transfer device switch which connects the intermediate internal node to the test mode internal mode. In addition, there is a third transfer device switch which connects the I/O pad to the normal mode internal mode. The circuit includes a pull-up load device, which is connected to a power supply voltage and to the intermediate internal mode. A test mode signal connects to a gate of the first transfer device switch, to a gate of the second transfer device switch. The test mode signal also connects to an inverter which inverts the test mode signal to produce a normal mode signal.

The above and other objects, features and advantages of the present invention will be better understood from the following detailed description taken in conjunction with the accompanying drawings.

BRIEF DESCRIPTION OF THE DRAWINGS

FIG. 1a is a prior art multi-input pad circuit.
FIG. 1b shows a prior art multi-input pad input signal.
FIG. 2b shows improved integrated circuit effects during phases of an input signal as a result of the circuit shown in FIG. 2a.

DESCRIPTION OF THE PREFERRED EMBODIMENT

Figure 2A:
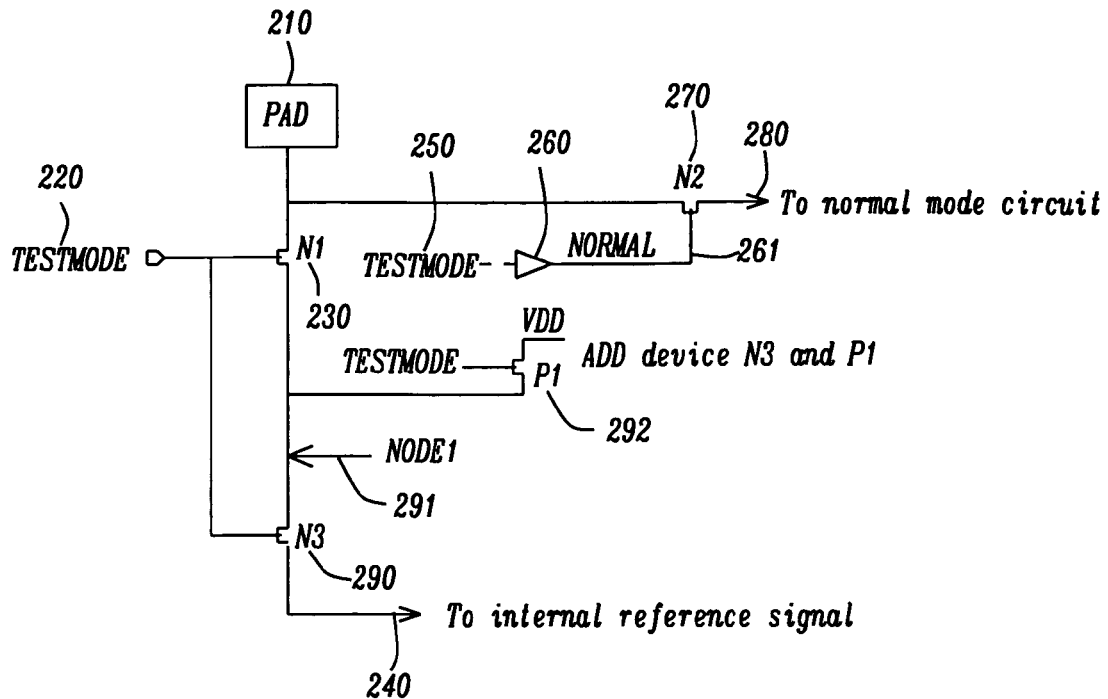
FIG. 2a shows a multi-input pad circuit which represents the main embodiment of this invention.

FIG. 2a shows the main embodiment of this invention. An input/output (I/O) pad 210 of an integrated circuit is shown. The I/O pad 210 feeds into three transfer gates, N1 (230) N2 (270) and N3 (290). N1, N2 and N3 are shown as an n-channel metal oxide semiconductor field effect transistors, NMOS FETs. P1 is shown as a p-channel metal oxide semiconductor field effect transistor, PMOS FET. The drain of device N1 is connected to the I/O pad 210. The source of N1 is connected to the new intermediate internal node, NODE1 (291). The gate of N1 is connected to the Test mode signal 220. The drain of device N2 is connected to the I/O pad 210. The source of N2 is connected to the normal mode internal node 280. The gate of N2 is connected to the Normal mode signal 261. This signal is the inverse of the Test mode signal 220. The Test mode signal 250 feeds an inverter 260 which outputs the Normal mode signal 261. The drain of device N3 is connected to the new intermediate internal node, NODE1 (291). The source of N3 is connected to the test mode internal reference node 240. The gate of N3 is connected to the Test mode signal 220. The source of P1 is connected to VDD. The drain of P1 is connected to the intermediate internal node, NODE1, and the gate of P1 is connected to the Test mode signal 220.

Device N3 is an addition over the prior art circuit of FIG. 1a. In test mode, the Test mode line 220 is driven to a High, VDD level, which turns ON the transfer gate N1 (230). This action connects the pad 210 to an intermediate internal node, NODE 1 (291). Node 1 feeds into the drain of transfer gate N3 (290). The source of transfer gate N3 (290) feeds an internal reference signal node 240. This allows the reference signal to be controlled by the external pad 210 during test mode.

During normal mode, the Test mode signal 250 or 220 will be low or inactive. The inverter 260 will produce a high level at node 261. This is the normal mode signal, which activates transfer device N2 (270) during normal mode. During normal mode operation, the pad 210 is connected to the Normal mode circuit 280. In addition, during normal mode, the Test mode signal 220 is low or inactive, and transfer devices N1 (230) and N3 (290) are OFF. This disconnects the path from the pad 210 to the internal reference signal node (240).

In the embodiment shown in FIG. 2a, PMOS device P1(292) has been added over the prior art circuitry. The drain of P1 drives NODE 1 (291). The source of P1 is connected to VDD. The gate of P1 is connected to the Test mode signal 220.

Figure 2B:
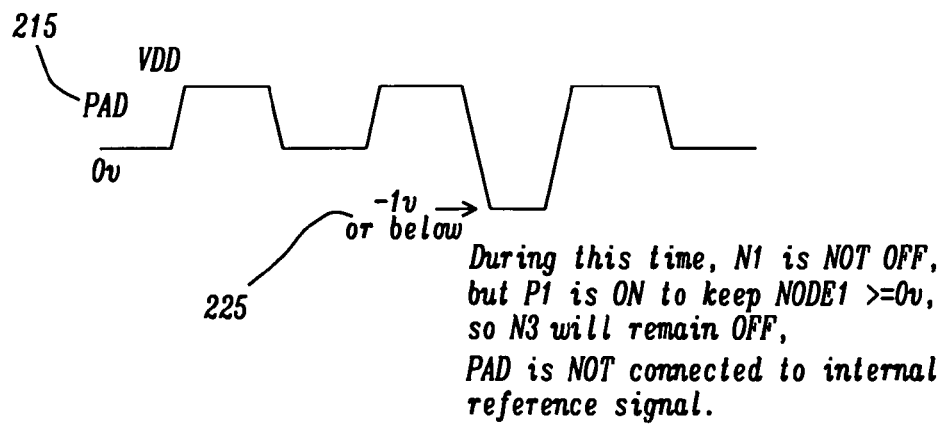

FIG. 2b shows a timing diagram 215 for a variable signal, which is applied to the pad 210 in the main embodiment of FIG. 2a. The signal shown in FIG. 2b, has an undershoot 225 where the voltage falls to −1 volt or below. During this time, device N1 is not OFF and the pad is connected to the new intermediate internal NODE 1 (291).

Also, during this time shown by 225 in FIG. 2b, new device P1(292) is ON. This new P1 device (292) serves to charge NODE1 (291) to keep its voltage greater than or equal to 0 volts, so device N3 will remain OFF. The importance of the new intermediate internal node, NODE1, is that it allows the new P1 device to charge this intermediate node in order to prevent device N3 from turning ON. This effectively disallows the pad 210 from being connected to the test mode circuitry and the internal reference signal node (240) during normal mode. This prevents chip failure due to false activation of the test mode circuitry. Therefore, new devices N3 (290), P1(292), and intermediate internal node, NODE1 (291) solve the 'undershoot' input pad noise problem exhibited by the prior art circuit of FIG. 1a.

As described in the above paragraphs, the added devices N3 and P1 of this invention prevent chip failure due to false activation of the Test Mode circuitry during Normal Mode. The key field effect transistor (FET) device principle considered is that n-channel metal oxide semiconductor (NMOS) FETs such as N1 and N3 in FIG. 2a of the instant application can turn ON if their gate voltages are High as during Test Mode. But NMOS devices such as N1 and N3 can also turn ON with minimal gate voltage during Normal Mode where the Test Mode signal is approaching a low level if the drain-to-source voltage (Vds) of devices N1 and/or N3 are non-zero. During Normal mode when there is "undershoot" at the input pad 210 of FIG. 2a, the Vds of device N1 is non-zero. This will cause internal node, NODE1, to go Low. This will make the Vds of device N3 non-zero and allow device N3 to turn ON and erroneously allow the Test Mode circuitry to affect Normal Mode operation. However, the p-channel metal oxide semiconductor (PMOS) device P1 of FIG. 2a will turn ON and boost node, NODE1, voltage back to a higher level to keep device N3 OFF and prevent the internal Test Mode circuit from affecting Normal Mode circuit operation.

The advantage of this invention is the simple and unique addition of two devices and a new intermediate internal node which prevent negative normal mode input voltage swings at the I/O pad from incorrectly turning ON the transfer gate to the test mode circuitry. This incorrect activation of the test mode circuit path would normally create chip failure during normal mode. This invention provides a simple addition of a load device which keeps an intermediate internal node charged to a proper level preventing the test mode path from being activated. The invention also provides a third transfer gate which creates this new isolated intermediate internal node.

While the invention has been described in terms of the preferred embodiments, those skilled in the art will recognize that various changes in form and details may be made without departing from the spirit and scope of the invention.

What is claimed is:

1. A negative voltage noise-free circuit for multi-functional pads comprising:
   an input/output (I/O) pad of an integrated circuit chip,
   a normal mode internal node, which connects to normal mode circuitry,
   a test mode internal node, which connects to test mode circuitry,
   a first transfer device switch which connects said input/output (I/O) pad to an intermediate internal node,
   a second transfer device switch which connects said intermediate internal node to said test mode internal node,
   a third transfer device switch which connects said input/output (I/O) pad to said normal mode internal node,
   a pull-up load device, which is connected to a power supply voltage and to said intermediate internal node, and
   a test mode signal which connects to a gate of said first transfer device switch, to a gate of said second transfer device switch, and to an inverter which inverts said test mode signal to produce a normal mode signal.

2. The negative voltage noise-free circuit of claim 1 wherein said (input/output) (I/O) pad is used for both normal mode function and for test mode function.

3. The negative voltage noise-free circuit of claim 1 wherein said input/output (I/O) pad is connected to said normal mode internal node during normal mode.

4. The negative voltage noise-free circuit of claim 1 wherein said input/output (I/O) pad is connected to said test mode internal node during test mode.

5. The negative voltage noise-free circuit of claim 1 wherein there is a first gate activation of said first transfer device switch by said test mode signal, wherein said first gate activation allows said input/output (I/O) pad to connect to said intermediate internal node during test mode.

6. The negative voltage noise-free circuit of claim 1 wherein there is a second gate activation of said second transfer device switch by said test mode signal, wherein said second gate activation allows said intermediate internal node to connect to said test mode internal node, during test mode.

7. The negative voltage noise-free circuit of claim 1 wherein there is a third gate activation of said third transfer device switch by said normal mode signal, wherein said third gate activation allows said input/output (I/O) pad to connect to said normal mode internal node during normal mode.

8. The negative voltage noise-free circuit of claim 1 wherein said pull-up load device charges said intermediate internal node which allows maintenance of above-zero voltage on said intermediate internal node.

9. The negative voltage noise-free circuit of claim 8 wherein said maintenance of said above-zero voltage on said intermediate internal node forces a prevention of said second transfer device switch from turning ON during a low-level transition on said input/output (I/O) pad.

10. The negative voltage noise-free circuit of claim 9 wherein said prevention of said second transfer device from turning ON during said low-level transition on said input/output (I/O) pad prevents said intermediate internal node from connecting to said test mode internal node during normal mode, wherein preventing normal mode chip failure.

11. A method for providing a negative voltage noise-free circuit for multi-functional pads comprising the steps of:
  providing an input/output (I/O) pad of an integrated circuit chip,
  providing a normal mode internal node, which connects to normal mode circuitry,
  providing a test mode internal node, which connects to test mode circuitry,
  providing a first transfer device switch which connects said input/output (I/O) pad to an intermediate internal node,
  providing a second transfer device switch which connects said intermediate internal node to said test mode internal node,
  providing a third transfer device switch which connects said input/output (I/O) pad to said normal mode internal node,
  providing a pull-up load device, which is connected to a power supply voltage and to said intermediate internal node, and
  providing a test mode signal which connects to a gate of said first transfer device switch, to a gate of said second transfer device switch, and to an inverter which inverts said test mode signal to produce a normal mode signal.

12. The method for providing a negative voltage noise-free circuit of claim 11 wherein said input/output (I/O) pad is used for both normal mode function and for test mode function.

13. The method for providing a negative voltage noise-free circuit of claim 11 wherein said input/output (I/O) pad is connected to said normal mode internal node during normal mode.

14. The method for providing a negative voltage noise-free circuit of claim 11 wherein said input/output (I/O) pad is connected to said test mode internal node during test mode.

15. The method for providing a negative voltage noise-free circuit of claim 11 wherein there is a first gate activation of said first transfer device switch by said test mode signal, wherein said first gate activation allows said input/output (I/O) pad to connect to said intermediate internal node during test mode.

16. The method for providing a negative voltage noise-free circuit of claim 11 wherein there is a second gate activation of said second transfer device switch by said test mode signal, wherein said second gate activation allows said intermediate internal node to connect to said test mode internal node, during test mode.

17. The method for providing a negative voltage noise-free circuit of claim 11 wherein there is a third gate activation of said third transfer device switch by said normal mode signal, wherein said third gate activation allows said input/output (I/O) pad to connect to said normal mode internal node during normal mode.

18. The method for providing a negative voltage noise-free circuit of claim 11 wherein said pull-up load device charges said intermediate internal node which allows maintenance of above-zero voltage on said intermediate internal node.

19. The method for providing a negative voltage noise-free circuit of claim 18 wherein said maintenance of said above-zero voltage on said intermediate internal node forces a prevention of said second transfer device switch from turning ON during a low-level transition on said input/output (I/O) pad.

20. The method for providing a negative voltage noise-free circuit of claim 19 wherein said prevention of said second transfer device from turning ON during said low-level transition on said input/output (I/O) pad prevents said intermediate internal node from connecting to said test mode internal node during normal mode, wherein preventing normal mode chip failure.

* * * * *